United States Patent [19]

Proto

[11] 4,142,239

[45] Feb. 27, 1979

[54] APPARATUS FOR GENERATING DIGITAL STREAMS HAVING VARIABLE PROBABILITIES OF ERROR

[75] Inventor: Richard C. Proto, Laurel, Md.

[73] Assignee: The United States of America as represented by the Secretary of the Army, Washington, D.C.

[21] Appl. No.: 811,391

[22] Filed: Jun. 29, 1977

[51] Int. Cl.$^2$ ............................................. G06F 1/00
[52] U.S. Cl. .................................. 364/717; 235/302.4
[58] Field of Search ...................... 235/302.4; 364/717

[56] References Cited

U.S. PATENT DOCUMENTS

| | | | |
|---|---|---|---|
| 3,405,258 | 10/1968 | Godoy et al. ...................... | 235/302.4 |
| 3,633,015 | 1/1972 | Lee ...................................... | 364/717 |
| 3,751,648 | 8/1973 | Wu ...................................... | 364/717 |
| 3,761,696 | 9/1973 | Russell .............................. | 364/717 |
| 4,032,763 | 6/1977 | Glitz .................................. | 364/717 |

OTHER PUBLICATIONS

Cormier et al.; "Computer Fault Generator" – *IBM Tech. Disc. Bulletin;* vol. 11, No. 8, pp. 924–926; Jan. 1969.

Primary Examiner—Malcolm A. Morrison
Assistant Examiner—Errol A. Krass
Attorney, Agent, or Firm—John R. Utermohle; Barry N. Young

[57] ABSTRACT

An apparatus for combining n independent, random binary streams into a single output stream in which the probability of occurrence of a binary "1" is of the form $k/2^n$. The apparatus which may be easily implemented with a minimum of simple logic elements, includes a combiner for the random streams of the form $$f = x_n(\ldots x_3(x_2 x_1 + a_1) + a_2 \ldots) + a_{n-1}$$

where $x_1, x_2 \ldots x_n$ are independent variables representing flat random digital streams and $a_1, a_2 \ldots a_{n-1}$ are coefficients of the variables $x_1, x_2 \ldots x_n$ having the value 0 or 1. Each value of k corresponds to a unique set of coefficients $a_1, a_2 \ldots a_{n-1}$ so that various probabilities of error may be easily obtained by a series of switches which select the appropriate values of the coefficients. The apparatus may conveniently be utilized for testing the performance of digital hardware, particularly communications equipment, under various error conditions.

12 Claims, 6 Drawing Figures

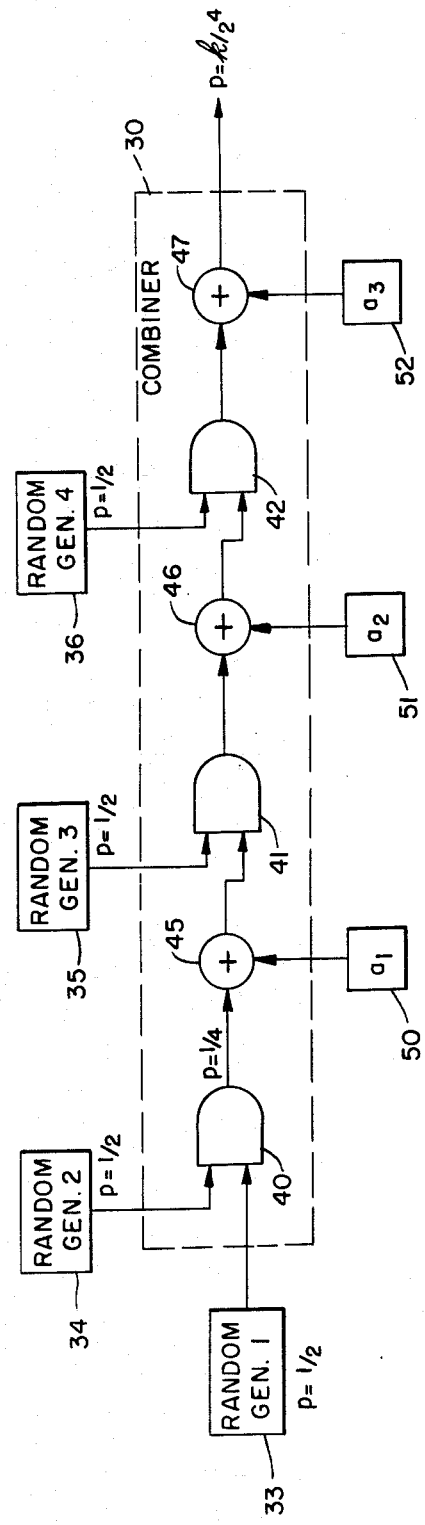
FIG. 2(a).
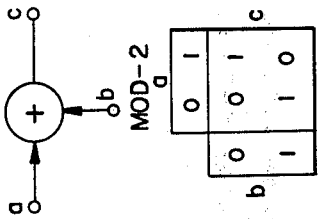
FIG. 2(c).
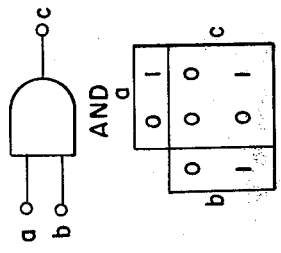
FIG. 2(b).
FIG. 2(d).

APPARATUS FOR GENERATING DIGITAL STREAMS HAVING VARIABLE PROBABILITIES OF ERROR

BACKGROUND OF THE INVENTION

This invention relates generally to the field of electrical error signal generators and more particularly to the field of electrical signal generators which are capable of generating binary digital streams having predetermined probabilities of error.

Frequently, during the design and testing phases of digital hardware, designers require equipment which will enable them to test the operation and performance of their prototype designs under various error conditions, in order to compare actual and predicted performance. In addition, error testing is a maintenance tool which is commonly used by maintenance personnel to monitor the performance of digital equipment or systems. This is particularly true in the communications industry, where data transmission equipment must operate reliably in the presence of noise. Noise added to digital signals during transmission or produced in equipment, can result in errors in the received data. Consequently, it is common for data transmission systems to employ complicated coding schemes, and error detection and correction circuitry in order to detect and correct errors in the data. Error testing is essential to insure that these circuits are performing properly.

One commonly used error testing technique involves generating known digital data, such as a predetermined code sequence of 1's and 0's, in which one or more bits of the sequence are altered in accordance with some predetermined scheme. The corrupted sequence is then input to the device under test, and the output of the device is compared with the originally generated data, to determine whether or not the errors were detected. Since the performance of equipment is most commonly measured in terms of its probability of detecting errors, it is convenient to be able to generate test sequences having known probabilities of error.

Although test equipment is generally available for this purpose, most commercially available equipment is either costly, difficult to use in terms of being able to set up specific probabilities of error, or limited in the range of error probabilities which it is capable of generating.

It is desirable to have an apparatus which will overcome the aforesaid disadvantages and it is to this end that the present invention is directed. Accordingly, there is provided by the invention, a new and improved apparatus, useful in performing error testing of digital equipment and systems, which is capable of generating digital test signals having specifiable probabilities of error over a large range of probabilities and which is easily implementable in hardware.

SUMMARY OF THE INVENTION

The invention is based upon the recognition of the fact that there exists a class of boolean functions having the general form $$f = x_n(\ldots(x_2(x_1 + a_0) + a_1) + a_2 \ldots) + a_{n-1} \quad (1)$$

where $x_i$, $i = 1, 2, \ldots n$, are random variables and $a_i$ are coefficients having a value of 0 or 1, having three interesting properties. These properties are:

I. There is a 1-to-1 correspondence between the set of all possible biases of the form $k/2^n$, where k is odd, and the functions of this class.

II. The function is easily derivable from the bias value.

III. The function is easily implementable in hardware. As used herein, bias is defined as the probability of the function having the value binary 1, over all possible input patterns of the random variables $x_i$. In particular, for n random variables, these functions have biases, i.e., probabilities of having the value 1, of the form $k/2^n$, where k is odd. Furthermore, since each function of the class is defined by the values of the coefficients $a_i$, the first property above, I., implies that each function of the class has associated with it a unique value of bias and conversely that each value of bias is associated with a unique set of coefficients $a_i$. Furthermore, implicit in the above is the fact that if the random variables represent random binary streams, which are combined in hardware in accordance with a function of the class defined by equation (1), the output digital stream will have a bias determined by the values of the coefficients $a_i$. Consequently, this output stream having a known probability of occurrence of 1's, can be combined with a known sequence of 1's and 0's to provide a test sequence having a known probability of error. This test sequence is useful in the testing of digital equipment.

Accordingly, it is an object of the invention to provide an apparatus for generating digital streams having specified probabilities of error.

It is also an object of the invention to provide such an apparatus in which the specified probability of error is easily selectable.

An apparatus having these and other advantages may include means for generating n independent, random digital streams, means for combining the random streams into a single output digital stream in accordance with a combining function of the form $$f = x_n(\ldots x_3(x_2 x_1 + a_1) + a_2 \ldots) + a_{n-1}$$

where $x_1, x_2 \ldots x_n$ are variables representing the random digital streams and $a_1, a_2 \ldots a_{n-1}$ are coefficients of the variables having the value 0 or 1, and means connected to the combining means for selecting the values of the coefficients such that the output digital stream has a probability of the occurrence of a 1 of the form $k/2^n$, where k is an odd number less than $2^n$.

BRIEF DESCRIPTION OF THE DRAWINGS

Other objects and advantages of the invention will be apparent from the following detailed description and upon reference to the drawings, in which:

FIG. 2 (a) illustrates a digital logic implementation of equation (1) for an apparatus capable of generating probabilities between 1/16 and 15/16;

FIGS. 2(b) and 2(c) define respectively the logical AND and the MOD 2 functions;

FIG. 2 (d) is a table giving the values of the coefficients of the apparatus of FIG. 2(a) corresponding to various probabilities.

DETAILED DESCRIPTION OF THE INVENTION

Figure 1:
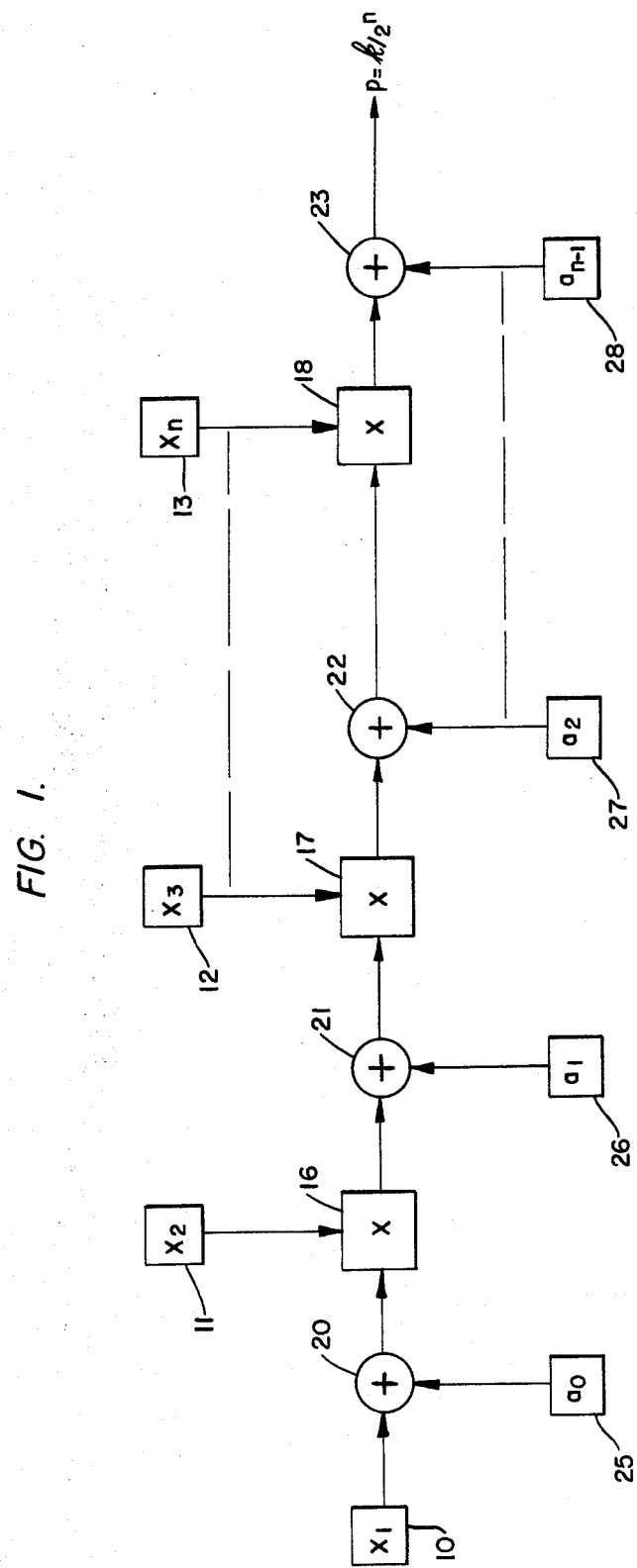
FIG. 1 is a functional block diagram of an implementation of the generalized combining function of equation (1)

FIG. 1 illustrates functionally the manner in which the class of functions defined by equation (1) may be implemented. The random variables, $x_i$, are represented by a plurality of blocks 10-13 which are combined in an interconnected series of multipliers 16-18 and adders 20-23. Except for variable $x_1$, 10, each of the random variables is input to one of two inputs of multipliers 16-18. The second input to the multipliers is the output of an adder 20-23 which adds the value of one of the coefficients, $a_i$, represented by blocks 25-28, to the output from the preceeding multiplier. Variable $x_1$, 10, is first added to coefficient $a_0$ in the first adder 20 prior to being input into the first multiplier 16.

It is easily demonstrated, that the apparatus defined by the block diagram of FIG. 1, implements equation 1. For example, the output of the first adder 20 of FIG. 1 is obviously $(x_1 + a_0)$, which corresponds to the innermost parenthetical term in equation (1). This term is then multiplied by the variable $x_2$, 11, in the first multiplier 16 and the result is added to $a_1$, 26, in the second adder 21. This produces $(x_2(x_1 + a_0) + a_1)$ corresponding to the second intermost parenthetical term in equation (1), and so forth.

For n independent random variables, the output bias or probability of the device illustrated functionally in FIG. 1, is equal to $k/2^n$ where k is an odd number less than $2^n$. Furthermoe, it can be shown that the output bias is independent of the value of coefficient $a_0$. Hence, $a_0$ may be arbitrarily taken to equal 0 and equation (1) rewritten as $$f = x_n(\ldots x_3(x_2 x_1 + a_1) + a_2 \ldots) + a_{n-1} \quad (2)$$

Taking $a_0$ to equal 0, permits the first adder 20 of FIG. 1 to be eliminated and the $x_1$ variable 10 to be input directly to the first multiplier 16.

In digital logic, the adder function of FIG. 1 may be implemented as a MOD 2 adder and the multiplier function of FIG. 1 may be implemented as an AND gate.

FIG. 2(a) illustrates a digital logic implementation of the apparatus of FIG. 1. A combiner 30 combines four random digital streams ($n = 4$) in accordance with equation (2), such that an output digital stream is obtained having any desired bias of the form $k/2^4$ between 1/16 and 15/16, for k odd.

Four random generators 33-36 are used to generate four random digital streams. The random digital streams are combined in combiner 30 comprising AND gates 40-42 and MOD 2 adders 45-47. For the apparatus of FIG. 2(a), $n = 4$, and equation (2) reduces to $$f = x_4(x_3(x_2 x_1 + a_1) + a_2) + a_3 \quad (3)$$

The AND logic function is defined in FIG. 2(b). As illustrated, the output, c, of the AND gate is 0 if either both inputs a and b are 0 or both inputs are different. The output is 1 only if both inputs a and b are 1's.

FIG. 2(c) illustrates the MOD 2 (exclusive-OR) logic function. If both inputs a and b to the MOD 2 adder are the same, i.e. both 0's or 1's, the output is 0. However, if the two inputs differ the output is 1. Another way of viewing the MOD 2 function is that if one of the inputs is held at a binary 1 the other input is inverted at the MOD 2 adder output. For example, if input b of the MOD 2 adder in FIG. 2(c) is = 1, the output will be 1 if input $a = 0$ and 0 if input $a = 1$. Therefore, the MOD 2 adders can be viewed as a controlled inverter, which will selectively invert one input depending upon whether or not the control input is a 1 or a 0.

In FIG. 2(a), each of blocks 50-52 provide an output which represents the value, either a 0 or a 1, of one the coefficients, $a_i$. In the apparatus of FIG. 2(a), blocks 50-52 representing the coefficients can be any means for providing either a 0 or a 1 to the MOD 2 adders 45-47. The simplest such means would be switches having terminals connected to logic 1 and logic 0 levels, which simply select the value of binary 1 or binary 0 depending the desired value for the coefficient.

Random generators 33-36 in the apparatus of FIG. 2(a) represent the random variables $x_i$ of equations (1) and (2) as previously described. The random generators 33-36 produce an output binary stream which is random, i.e. the probability of the random generator outputting a binary 1 is equal to the probability that the random generator will output a binary 0. Therefore, each random generator has the probability of outputting a binary 1, designated by p, equal to ½.

In FIG. 2(a), the outputs of random generators 33 and 34, each having $p = ½$, are multiplied in AND gate 40. Therefore, the probability of a 1 appearing on the output of AND gate 40 is $p = ½ \times ½ = ¼$. If, for example, coefficient $a_1$ is assumed to have the value 1, the probability of a 1 appearing on the output of MOD 2 adder 45 will be ¾, i.e. if $a_1$ is equal to 1, as previously mentioned, the other input to MOD 2 adder 45 will be inverted on the output. If the probability of the occurrence of a 1 on the input to adder 45 from gate 40 is equal to ¼ and this input is inverted in MOD 2 adder 45 due to a $a_1$ being 1, the output of MOD 2 adder 45 obviously has the probability of occurrence of a 1 equal to ¾. AND gate 41 then multiplies this output from MOD 2 adder 45 by the output from random generator 35 resulting in the input to MOD 2 adder 46 having a probability equal to ¾ × ½ or ⅜. If then, coefficient $a_2$ is assumed to be equal to 0, the output of MOD 2 adder 46 to AND gate 42 will also be ⅜. Since random generator 36 also has $p = ½$, the output of AND gate 42 will be 3/16. The output of AND gate 42 is then input to MOD 2 adder 47 to be added with the value of coefficient $a_3$. If $a_3$ is equal to 0, the output of MOD 2 adder 47, which is the output of combiner 30, will be 3/16. Therefore, with coefficients $a_1$, $a_2$, $a_3$, = 1, 0, 0, the apparatus of FIG. 2(a) will generate an output binary stream having a probability of occurrence of 1's equal to 3/16. This corresponds to the second line of the table in FIG. 2(d).

The table of FIG. 2(d) gives the values for the coefficients $a_1$, $a_2$, $a_3$ to generate any odd probability between 1/16 and 15/16. It can be seen from FIG. 2(d), that associated with each probability p, there is a unique set of coefficients $a_1$, $a_2$, $a_3$.

For any n and bias $k/2^n$, a vector I can be defined, where $I = (a_1, a_2, \ldots a_{n-1})$ is the inversion pattern of coefficients necessary to produce a desired bias. Furthermore, this inversion pattern is unique for each value of k, where k is odd and less than $2^n$.

There exists a simple algorithm for determining the set of coefficients corresponding uniquely to each value of bias. For example, for the apparatus illustrated in FIG. 2(a), suppose it is desired to determine the coefficients corresponding to a bias of 13/16. In this case, $k = 13$ and $n = 4$, i.e., $2^4 = 16$. The value of k is first written in binary form as a sum of a series of powers of 2, to degree n-1. In binary form, k may be expressed as $$k = b_0(2^0) + b_1(2^1) + \ldots b_{n-1}(2^{n-1}) \quad (4)$$

where $b_0, b_1, \ldots b_{n-1}$ are coefficients having a value 0 or 1. For $k = 13$ equation (4) becomes $$13 = 1(2^0) + 0(2^1) + 1(2^2) + 1(2^3) \quad (5)$$

Neglecting the value of coefficient $b_0$, the 3-tuple consisting of the three higher order coefficients of the powers of two ($b_1$, $b_2$, $b_3$) is $$(0\ 1\ 1) \quad (6)$$

The rightmost bit of (6), corresponding to $b_3$, is taken to be the value of coefficient $a_3$, i.e. 1, and this bit is MOD 2 added to each of the remaining bits of (6) to produce the 2-tuple $$(1\ 0) \quad (7)$$

Coefficient $a_2$ is set equal to the rightmost bit of (7), i.e. 0, and this bit is MOD 2 added to the remaining bit of (7) to produce the 1-tuple $$(1) \quad (8)$$

This bit is taken to be the value of coefficient $a_1$ and the vector $I = (a_1, a_2, a_3)$ becomes $$I = (1\ 0\ 1) \quad (9)$$

which corresponds to the coefficient values indicated in the table of FIG. 2(d) for $p = 13/16$. The remaining sets of coefficients corresponding to the other biases given in FIG. 2(d) can be found in a similar manner.

This algorithm may generalized in that the value of any coefficient, $a_{n-i}$, for ($1 \leq i \leq n-1$), may be found from the MOD 2 addition of the $b_{n-i}$ and the $b_{n-i+1}$ coefficients of the binary representation of k. In equation form $$a_{n-i} = b_{n-i} \oplus b_{n-i+1} \quad (10)$$

for ($1 \leq i \leq n-1$), where the symbol $\oplus$ represents MOD 2 addition. To illustrate, in the above example, $b_1$, $b_2$, $b_3$ = 0, 1, 1. Therefore, $n = 4$ and from equation (10), the value of $a_3 = b_3 \oplus b_4$, ($i = 1$). The coefficient $b_4$ is obviously 0 and $b_3 = 1$. Thus, $a_3 = 1 \oplus 0 = 1$, as before. Similarly, $a_2 = b_2 \oplus b_3 = 1 \oplus 1 = 0$ and $a_1 = b_1 \oplus b_2 = 0 \oplus 1 = 1$.

The apparatus in FIG. 2(a) can be extended to generate any bias $k/2^n$, for k odd and less than $2^n$ by the addition of AND gates and MOD 2 adders to combiner 30. The vectors $I = (a_1, a_2, \ldots a_{n-1})$ representing the sets of $n-1$ coefficients corresponding to each odd bias between $\frac{1}{2}^n$ and $2^n \frac{1}{2}^n$ can be determined using the above described algorithm.

It is necessary that random generators 33-36 in FIG. 2(a) generate independent, flat, random digital streams for input to combiner 30. This means that the random generators 33-36 should be unbiased, i.e., have equal probabilities of occurrence of 1's and 0's and that the random streams be independent of each other, or at least sufficiently uncorrelated so as to insure that there is no interdependence among them. Random generators 33-36 may be implemented in a number of ways known to those skilled in the art. For example, each may be implemented by using a noise diode as a source of random noise which is input to a voltage comparator. The comparator outputs a 1 when its input voltage exceeds a set threshold. This threshold can be adjusted such that there is an equal probability of the comparator outputting a 1 or a 0. The comparator outputs can then be clocked by some reference frequency, utilizing logic gates, to output the random streams at any desired rate.

The apparatus of FIG. 2(a) may also be designed to operate over a limited range of biases or at a number of fixed, specified biases, thereby permitting simplification of combiner 30. For example, inspection of FIG. 2(d) reveals that coefficient $a_3$ is equal to 0 for all biases between 1/16 and 7/16. If an apparatus with biases only within this range is required, it is possible to eliminate MOD 2 adder 47 and coefficient generator 52 corresponding to coefficient $a_3$, since a 0 input to MOD 2 adder 47 from 52 simply allows the output of AND gate 42 to pass through the MOD 2 adder uninverted. Furthermore, the MOD 2 adders 45-47 could be replaced with inverter amplifiers and switches which select either the inverted output from the amplifier or the non-inverted output from AND gates 40-42. A coefficient value of 1 would correspond to the inverted output from the amplifier while a value of 0 would correspond to the non-inverted output from the AND gate.

A slight modification of the apparatus of FIG. 2(a) also permits the apparatus to generate biases for k even. For example, if $k = 2m$, then $p = 2m/2^n = m/2^{n-1}$. If random generator 36 is caused to have $p = 1$, i.e. a constant 1 input to AND gate 42, then the apparatus of FIG. 2(a) will generate biases of the form $m/2^{n-1}$ for m odd. This permits biases between $\frac{1}{8}$ and $\frac{7}{8}$ to be generated, which is equivalent to biases between 2/16 and 14/16.

Figure 3:
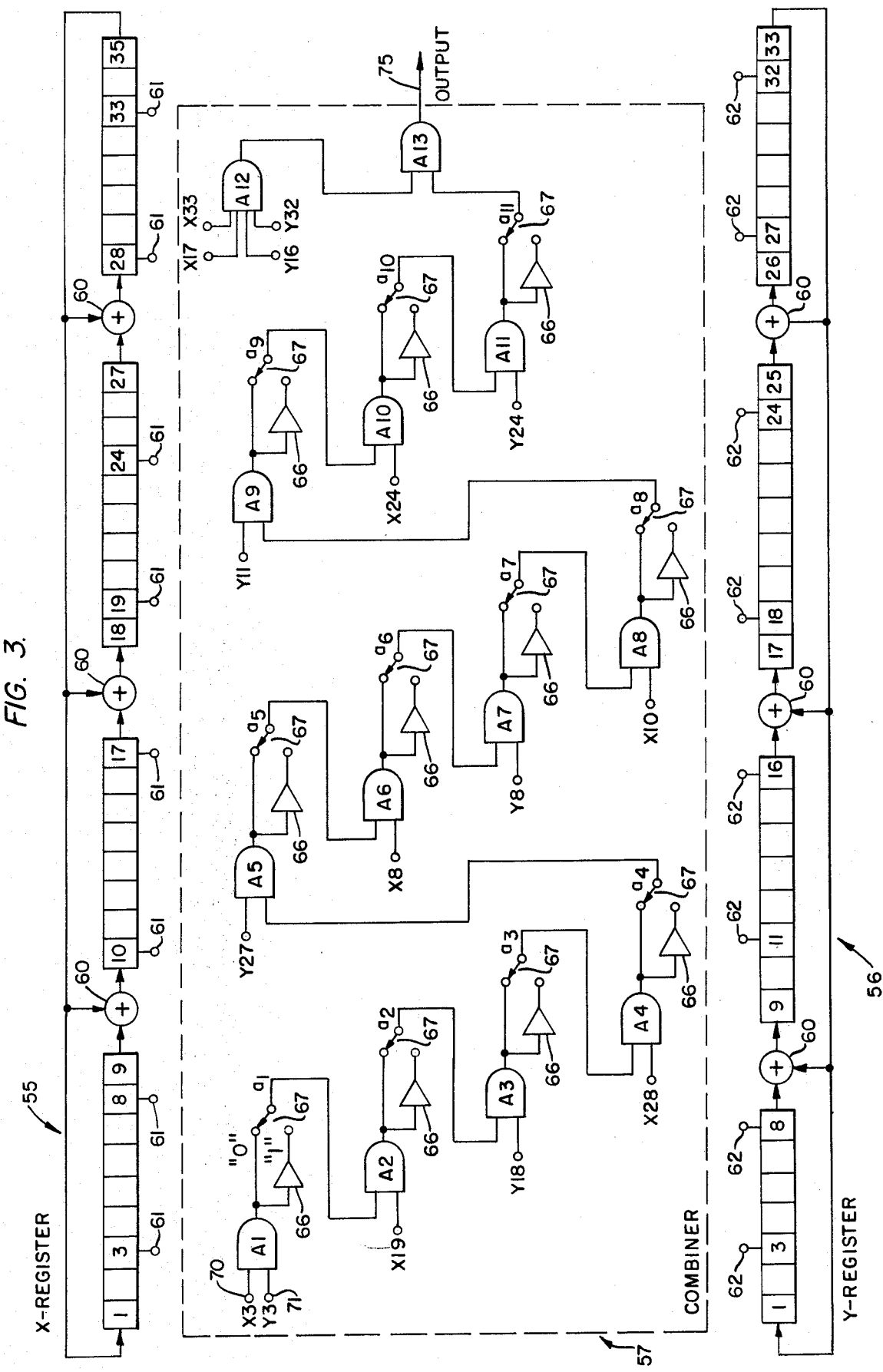
FIG. 3 illustrates an embodiment of an error generator constructed in accordance with the invention.

FIG. 3 is an illustration of an error generator embodying the principles of the invention, which is capable of generating various probabilities between $\frac{1}{2}^{16}$ and $4095/2^{16}$. The apparatus of FIG. 3 utilizes two feedback shift registers, X-register 55 and Y-register 56 to generate independent random digital streams for input to combiner 57. Shift registers 55 and 56 utilize MOD 2 adders 60—60 between selected stages in order to provide feedback. The position of MOD 2 adders 60—60 between stages is selected so that each register 55 and 56 will generate a maximal length pseudo-random sequence. The X-register 55 is a 35 stage shift register which has a cycle length of $2^{35} - 1$ for the illustrated feedback connections. The Y shift register 56 is a 33 stage shift register having a cycle length of $2^{33} - 1$. Taps 61—61, 62—62 are provided from selected stages of both shift registers 55 and 56 respectively. As illustrated, the X-register 55 is provided with eight taps 61—61 from stages 3, 8, 10, 17, 19, 24, 28 and 33. Similarly, the Y-register 56 is provided with eight taps 62—62 from stages 3, 8, 11, 16, 18, 24, 27 and 32. This gives a total of sixteen random streams for input to combiner 57.

Combiner 57 comprises a plurality of AND gates A1-A13, inverter amplifiers 66—66 and switches 67—67. Each of the eleven switches 67—67 corresponds to one of coefficients $a_1, a_2 \ldots a_{11}$. Inverter amplifiers 66—66 and switches 67—67 are connected as illustrated, on the output of the first 11 AND gates, A1-A11, such that either an inverted or a non-inverted output may be selected for input to the next succeeding AND gate. Inverter amplifiers 66—66 and switches 67—67 perform the same functions as the MOD 2 adders and coefficient generators of FIG. 2(a).

The first AND gate, A1, has one input terminal 70 connected to the tap 61 of X-register stage 3, as indicated by the designation X3, and the other input terminal 71 is connected to tap 62 of stage 3 of Y-register 56, as indicated by the designation Y3. AND gates A2–A11 have one of their inputs derived from one of switches 67—67, which selects either the inverted or the non-inverted output of a preceeding inverter amplifier or AND gate. The other input is connected to one of the taps 61—61 or 62—62 of either register 55 or register 56. These inputs are indicated by either the letter X or the letter Y and a numeral to indicate the register and stage from which the input is derived. AND gate A12 is a four input AND gate having its four inputs connected to four taps of registers 55 and 56. AND gate A13 has one input connected to the output of AND gate A12 and the other input connected to the switch output, of AND gate A11. The output on terminal 75 is a binary stream having a bias determined by the positions of switches 67—67. The binary stream output on terminal 75 is at the same rate as registers 55 and 56 are stepped.

The taps 61—61, 62—62 of the stages of shift registers 55 and 56, as well as their connection to AND gates 65—65 of combiner 57, were selected so that the input streams to the AND gates of combiner 57 were reasonably uncorrelated, in order to simulate independent, random generator inputs.

TABLE 1, below, gives switch settings for switches 67—67 corresponding to coefficients $a_1, a_2 \ldots a_{11}$, for various probabilities between 0.0001 and 0.05 for the apparatus of FIG. 3. A "0" indicates that the switch position is such as to select the non-inverted output from the corresponding AND gate. A "1" indicates selection of the inverted output from the corresponding inverter amplifier. For each probability listed in Table 1 the switch settings are the previously described inversion pattern or I vector, which corresponds to the values of the coefficients of equation (2). Extensive computer simulations were conducted on the apparatus illustrated in FIG. 3 to determine how well its actual performance matched its theoretical performance. The column labeled "Actual" in the table gives the actual measured probabilities corresponding to the predicted probabilities listed therein.

TABLE I

Switch Settings for the Apparatus of FIG. 3

| Probability | | Coefficient Values | | | | | | | | | | |
|---|---|---|---|---|---|---|---|---|---|---|---|---|
| Predicted | Actual | $a_1$ | $a_2$ | $a_3$ | $a_4$ | $a_5$ | $a_6$ | $a_7$ | $a_8$ | $a_9$ | $a_{10}$ | $a_{11}$ |
| .0001 | .000107 | 0 | 1 | 0 | 0 | 0 | 0 | 0 | 0 | 0 | 0 | 0 |
| .0002 | .000198 | 1 | 0 | 1 | 0 | 0 | 0 | 0 | 0 | 0 | 0 | 0 |
| .0003 | .000290 | 1 | 0 | 1 | 1 | 0 | 0 | 0 | 0 | 0 | 0 | 0 |
| .0004 | .000412 | 1 | 1 | 0 | 1 | 0 | 0 | 0 | 0 | 0 | 0 | 0 |
| .0005 | .000504 | 0 | 0 | 0 | 1 | 1 | 0 | 0 | 0 | 0 | 0 | 0 |
| .0006 | .000595 | 0 | 1 | 0 | 1 | 1 | 0 | 0 | 0 | 0 | 0 | 0 |
| .0007 | .000687 | 1 | 0 | 1 | 1 | 1 | 0 | 0 | 0 | 0 | 0 | 0 |
| .0008 | .000809 | 1 | 1 | 1 | 0 | 1 | 0 | 0 | 0 | 0 | 0 | 0 |
| .0009 | .0009003 | 1 | 1 | 0 | 0 | 1 | 0 | 0 | 0 | 0 | 0 | 0 |
| .001 | .000992 | 0 | 0 | 0 | 1 | 1 | 0 | 0 | 0 | 0 | 0 | 0 |
| .002 | .001999 | 1 | 0 | 0 | 0 | 1 | 1 | 0 | 0 | 0 | 0 | 0 |
| .003 | .003006 | 1 | 1 | 0 | 0 | 1 | 0 | 1 | 0 | 0 | 0 | 0 |
| .004 | .00401 | 0 | 1 | 0 | 0 | 0 | 1 | 1 | 0 | 0 | 0 | 0 |
| .005 | .00499 | 0 | 1 | 0 | 0 | 1 | 1 | 1 | 0 | 0 | 0 | 0 |
| .006 | .005997 | 0 | 1 | 1 | 0 | 0 | 1 | 0 | 1 | 0 | 0 | 0 |
| .007 | .007004 | 1 | 1 | 1 | 0 | 1 | 0 | 0 | 1 | 0 | 0 | 0 |
| .008 | .00801 | 0 | 1 | 0 | 0 | 0 | 0 | 1 | 1· | 0 | 0 | 0 |
| .009 | .00899 | 1 | 0 | 1 | 0 | 1 | 1 | 0 | 1 | 0 | 0 | 0 |
| .01 | .009995 | 0 | 0 | 1 | 0 | 0 | 1 | 1 | 1 | 1 | 0 | 0 |
| .02 | .020004 | 0 | 0 | 0 | 1 | 0 | 0 | 1 | 1 | 1 | 1 | 0 |
| .03 | .03001 | 0 | 0 | 1 | 1 | 1 | 1 | 0 | 0 | 0 | 1 | 0 |
| .04 | .03999 | 1 | 0 | 0 | 0 | 1 | 0 | 0 | 1 | 1 | 1 | 1 |
| .05 | .05003 | 1 | 0 | 1 | 0 | 1 | 0 | 1 | 0 | 1 | 0 | 1 |

("1" indicates invert output of AND gate)

To utilize the apparatus of FIG. 3 for error testing, it is sufficient to provide the binary stream on output terminal 75 to a MOD 2 adder, the other input of which is a known code sequence, stepped in synchronism with registers 55 and 56. Each time a 1 appears in the binary stream generated by the apparatus of FIG. 3 the MOD 2 adder will cause an inversion to occur in the corresponding bit of the code sequence. This will produce a binary stream out of the MOD 2 adder having a known probability of error, which can be fed to a device under test.

While the foregoing description has been reference to particular embodiments, it will be appreciated by those skilled in the art that variations are possible without the departing from the spirit and intent of the invention. It is intended that the invention be limited only by the appended claims.

What is claimed is:

1. An apparatus for generating a digital stream having variable error probabilities comprising:

means for generating n independent, random digital streams;

means for combining said random streams into a single output digital stream, in accordance with a combining function of the form $$f = x_n(\ldots x_3(x_2 x_1 + a_1) + a_2 \ldots) + a_{n-1}$$

where $x_1, x_2 \ldots x_n$ are variables representing the random digital streams and $a_1, a_2 \ldots a_{n-1}$ are coefficients of the variables $x_1, x_2 \ldots x_n$, said coefficients having the values 0 or 1; and means connected to the combining means for selecting the values of said coefficients such that said output digital stream has a probability of the occurrence of a 1 of $k/2^n$, where k is an odd number less than $2^n$.

2. The apparatus of claim 1, wherein said combining means further includes:

$n-1$ multiplier means, each having at least first and second inputs and an output, for producing an output signal representative of the product of the signals appearing on the inputs, said multiplier means being series connected such that said first input is connected to one of said random streams and said second input of certain of said multiplier means is connected to the output of a preceeding multiplier means in the series connection.

3. The apparatus of claim 2 wherein the first of said $n-1$ multiplier means in the series connection has its second input connected to one of said random streams.

4. The apparatus of claim 2, wherein said combining means also includes means connected between the output of certain of said multiplier means and the input to the next succeeding multiplier means in the series connection, for selectively inverting, in accordance with the values of said coefficients $a_1, a_2 \ldots a_{n-1}$, the output signals of said multiplier means, prior to said signals being input to the next multiplier means.

5. The apparatus of claim 4 wherein the output of multiplier means $n-i$ is inverted if the value of the corresponding coefficient $a_{n-i}$ is equal to 1, where $(1 \leq i \leq n-1)$.

6. The apparatus of claim 5 wherein said multiplier means are AND gates and said selective inverting means are MOD 2 adders.

7. The apparatus of claim 5 wherein said selective inverting means include inverter amplifiers having their input connected to the output of said multiplier means and their outputs connected to switches, said switches having second inputs connected to the outputs of said multiplier means such that either a normal or an inverted output from said multiplier means may be selected.

8. The apparatus of claim 1 wherein each set of values of the coefficients $a_1, a_2 \ldots a_{n-1}$ is uniquely determined by each value of k.

9. The apparatus of claim 8 wherein said coefficients $a_1, a_2 \ldots a_{n-1}$ are related to the coefficients $b_1, b_2 \ldots b_{n-1}$ of the binary representation of the number k, such that the value of each coefficient $a_{n-i}$ is given by $$a_{n-i} = b_{n-i} \oplus b_{n-i+1}$$

where ($1 \leq i \leq n-1$).

10. The apparatus of claim 1 wherein said means for generating said random digital streams further comprises a multi-stage shift register having feedback connections between selected stages such that said shift register generates a pseudo-random sequence.

11. The apparatus of claim 10 wherein said n random streams are derived from output taps connected to selected shift register stages.

12. The apparatus of claim 1 further comprising:
means for providing a known binary sequence; and
means for adding bit-by-bit said known binary sequence to said output digital stream from said combiner to produce a test sequence, wherein the bits of said test sequence are inverted with respect to their original values in said known binary sequence when the corresponding bits of said output digital stream are 1's, thereby providing a digital stream having a probability of error of $k/2^n$.

* * * * *